United States Patent
Freudenthal

(10) Patent No.: US 11,686,957 B2
(45) Date of Patent: Jun. 27, 2023

(54) SYNCHRONOUS PHOTOELASTIC MODULATOR DRIVING AND DETECTION

(71) Applicant: Hinds Instruments, Inc., Hillsboro, OR (US)

(72) Inventor: John Freudenthal, Portland, OR (US)

(73) Assignee: Hinds Instruments, Inc., Hillsboro, OR (US)

( * ) Notice: Subject to any disclaimer, the term of this patent is extended or adjusted under 35 U.S.C. 154(b) by 626 days.

(21) Appl. No.: 16/692,796

(22) Filed: Nov. 22, 2019

(65) Prior Publication Data

US 2020/0174289 A1 Jun. 4, 2020

Related U.S. Application Data

(60) Provisional application No. 62/773,967, filed on Nov. 30, 2018.

(51) Int. Cl.
*G02F 1/03* (2006.01)
*H03L 7/093* (2006.01)
*G02F 1/11* (2006.01)

(52) U.S. Cl.
CPC ............ *G02F 1/0327* (2013.01); *G02F 1/113* (2013.01); *H03L 7/093* (2013.01)

(58) Field of Classification Search
CPC .... G02F 1/0131; G02F 1/0123; G02F 1/0113; G02F 1/0327; G02F 27/0068; G02F 2006/12142
See application file for complete search history.

(56) References Cited

U.S. PATENT DOCUMENTS

| 6,970,278 | B1 | 11/2005 | Buican |
| 9,780,870 | B1 | 10/2017 | Zortman et al. |
| 2019/0068069 | A1* | 2/2019 | Sheng ............... H02M 3/33573 |

OTHER PUBLICATIONS

K.W .Li "Modulation axis performs circular motion in a 45° dual-drive symmetric photoelastic modulator" (Year: 2016).*

* cited by examiner

*Primary Examiner* — Christopher Stanford
*Assistant Examiner* — Journey F Sumlar
(74) *Attorney, Agent, or Firm* — Klarquist Sparkman, LLP

(57) ABSTRACT

Apparatus include a photoelastic modulator (PEM) optical element, a controller having a frequency generator configured to produce a frequency signal at a selected frequency based on a clock signal of the controller wherein the controller is configured to produce a PEM driving signal based on the frequency signal, a PEM transducer coupled to the PEM optical element and the controller and configured to drive the PEM with the PEM driving signal, and a detector optically coupled to the PEM optical element and configured to receive a PEM modulated output and to produce a PEM detection signal that includes a PEM modulation signal, wherein the controller is configured to receive the PEM detection signal and to extract the PEM modulation signal from the PEM detection signal using the frequency signal and the clock signal.

29 Claims, 10 Drawing Sheets

SYNCHRONOUS PHOTOELASTIC MODULATOR DRIVING AND DETECTION

CROSS REFERENCE TO RELATED APPLICATION

This application claims the benefit of U.S. Provisional Patent Application No. 62/773,967, filed Nov. 30, 2018, which is incorporated by reference herein in its entirety.

FIELD

The field is photoelastic modulation systems and methods.

BACKGROUND

Photoelastic modulation can be used for various applications. However, many current approaches rely on an expensive lock-in amplifier, which can limit various system capabilities, and which typically include an amount of noise associated with locking onto a reference signal. Thus, a need remains for approaches without the aforementioned drawbacks.

SUMMARY

In example systems herein, a single digitally controlled signal is used to produce the frequency to drive an optical modulator, such as a photoelastic modulator, and to act as the frequency source for the synchronous detection. This scheme eliminates the need for the additional 'lock-in' method and avoids the associated noise and frequency uncertainty.

According to an aspect of the disclosed technology, apparatus include a photoelastic modulator (PEM) optical element, a controller having a frequency generator configured to produce a frequency signal at a selected frequency based on a clock signal of the controller, wherein the controller is configured to produce a PEM driving signal based on the frequency signal, a PEM transducer coupled to the PEM optical element and the controller and configured to drive the PEM with the PEM driving signal, and a detector optically coupled to the PEM optical element and configured to receive a PEM modulated output and to produce a PEM detection signal that includes a PEM modulation signal, wherein the controller is configured to receive the PEM detection signal and to extract the PEM modulation signal from the PEM detection signal using the frequency signal and the clock signal. In some examples, the selected frequency is a non-resonant frequency of the PEM optical element. Some embodiments further include an optical source situated to direct an optical beam to the PEM optical element, wherein the optical source is situated to receive an optical source frequency signal from the controller that is produced with the clock signal and situated to produce the optical beam according to the optical source frequency signal. Some examples further include an optical source situated to direct an optical beam to the PEM optical element, wherein the controller is situated to receive an optical source frequency signal from the optical source and configured to produce the frequency signal based on the clock signal and the optical source frequency signal. In some examples, the controller is configured to lock onto the optical source frequency signal with a phase-locked loop. Some embodiments further include a second PEM optical element and a second PEM transducer coupled to the second PEM optical element to drive the second PEM optical element according to a second PEM driving signal, wherein the controller has a second frequency generator configured to produce a second frequency signal at a selected second frequency based on the clock signal of the controller, wherein the controller is configured to produce a PEM driving signal based on the second frequency signal. In selected examples, the second frequency is different from the frequency of the frequency signal. In some examples, the controller is configured to calculate a harmonic of the frequency and the second frequency and to produce a corresponding harmonic frequency signal, and wherein a frequency of the extracted PEM modulation signal corresponds to the frequency of the harmonic frequency signal. Some examples further include a tank filter, wherein the frequency signal is a square-wave high-low signal and the tank filter is configured to convert the square-wave high-low signal to a sinusoidal signal. Some examples further include a high voltage transformer configured to receive the sinusoidal signal and to produce the PEM driving signal. Some embodiments further include a feedback filter coupled to the PEM transducer and configured to filter a return signal from the PEM transducer to produce a filtered return signal, and a phase comparator situated to receive the filtered return signal and configured to compare current and voltage signal components of the filtered return signal to determine a phase difference. In some examples, the feedback filter includes a Sallen-Key filter. In some embodiments, the controller is configured to mix momentary phase numerical sine and cosine values of the frequency signal selected from a look-up table with the PEM detection signal and to calculate amplitude and phase of the PEM modulation signal from the mixed values. In some examples, the controller is configured to trigger the detector based on the frequency signal. In some embodiments, the controller includes a field programmable gate array configured to produce the frequency signal with direct digital synthesis. Some embodiments further include a second PEM transducer coupled to the PEM optical element to drive the PEM optical element according to a second PEM driving signal.

According to another aspect of the disclosed technology, methods include generating a PEM driving signal with a controller frequency generator configured to produce a frequency signal at a selected frequency based on a clock signal of the controller, driving a PEM transducer coupled to a PEM optical element according to the PEM driving signal, synchronously detecting a PEM modulated output from the PEM optical element, and determining a PEM modulation signal based on a mixing and demodulation of the frequency signal, clock signal, and the synchronously detected PEM modulated output. In some examples, the controller frequency generator is a direct digital synthesizer of a field programmable gate array. Some examples further include generating an optical source frequency signal based on the frequency signal and the clock signal, and producing a pulsed optical beam according to the optical source frequency signal. Some examples further include generating a second PEM driving signal and driving a second PEM transducer coupled to a second PEM optical element according to the second PEM driving signal.

According to another aspect of the disclosed technology, methods include producing a direct digital synthesized high-low signal output at a predetermined PEM driving frequency, producing a high-low voltage signal corresponding to the high-low signal output with a voltage source, filtering the high-low voltage signal with a tank filter to produce a sinusoidal signal, and amplifying the sinusoidal signal with a high voltage transformer to produce a PEM driving signal.

The foregoing and other objects, features, and advantages of the disclosed technology will become more apparent from the following detailed description, which proceeds with reference to the accompanying figures.

DETAILED DESCRIPTION

Figure 1:
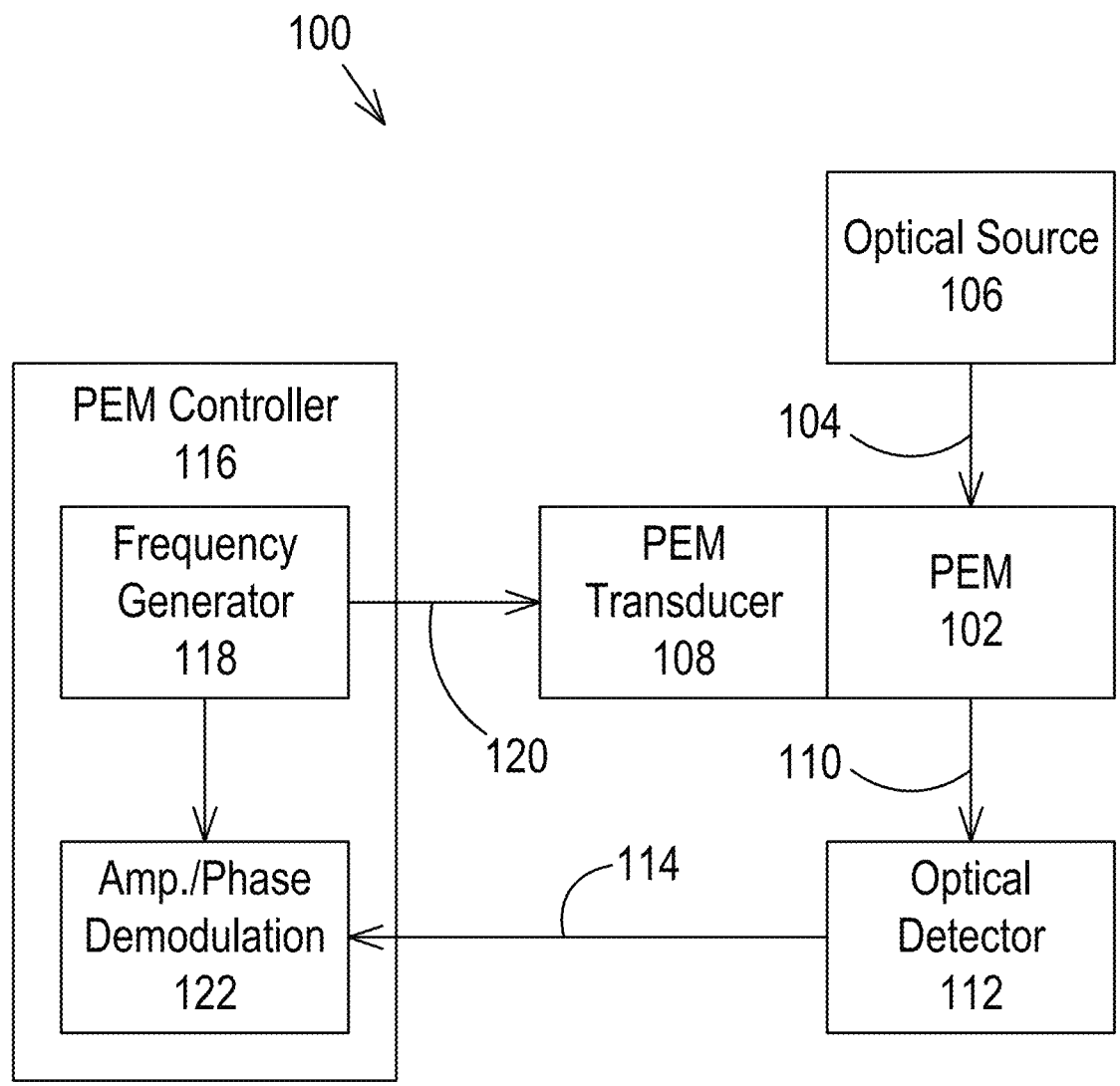
FIGS. 1-6 are schematics of example PEM optical system and apparatus.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest," "best," "minimum," or the like. It will be appreciated that such descriptions are intended to indicate that a selection among many used functional alternatives can be made, and such selections need not be better, smaller, or otherwise preferable to other selections.

Photoelastic modulators change the polarization state of light via the photoelastic effect. A piezo transducer induces a resonant standing wave on an isotropic material. The strain of the standing wave produces a time varying birefringence in the material. Light passing through the material is retarded by the birefringence in a well-controlled, precise manner. Traditionally, analogue control circuitry adjusts the frequency of oscillation at the piezo transducer. A reference square wave is then produced from the signal driving the piezo transducer to act as the source of the lock-in signal. A lock-in amplifier takes this square wave reference signal and produces its own frequency reference. The phase lock loop or other associated 'lock-in' methods within the lock-in amplifier have their own uncertainty and ambiguities which can lower the signal to noise of the overall system.

In example systems herein, a single digitally controlled signal is used to produce the frequency to drive the photoelastic modulator and to act as the frequency source for the synchronous detection. This scheme eliminates the need for the additional 'lock-in' method and avoids the associated noise and frequency uncertainty.

When operating an optical system with multiple photoelastic modulators, the frequency of interest may be the sum or difference of the fundamental frequency of each modulator. For instance, in an optical path with two photoelastic modulators (PEM), the frequency of interest may be the sum of double the first PEM frequency minus the frequency of the second PEM frequency $2F_1-1F_2$. When using a lock-in amplifier to calculate this frequency, the jitter and associated uncertainties with each modulator compound themselves.

By using a single digital frequency generator for each PEM, the sum and difference harmonics can be calculated exactly. The precise digital frequency control allows for the use of a large number of precisely controlled PEMs (e.g., two, three, four, or more) without the inevitable sum of jitter noise when using lock-in amplifiers to calculate the harmonic frequencies.

In addition, some applications require pulsed light sources such as pulsed lasers. These sources come in two forms; triggered and untriggered. Triggered sources will fire so long as the timing requirements between firing events is met. Untriggered sources will fire at a regular frequency and output their own reference signal when firing. For triggered sources, the digitally controlled PEM frequency generator can fire the light source at precisely the moment of interest during the PEM frequency cycle. This eliminates the need for additional timing hardware to observe the PEM frequency and predict ahead of time when to fire the light source. For untriggered sources, the digitally controlled PEM can use a standard lock-in routine to measure the frequency of the light source and lock-in to the harmonic of interest with reference to all the PEMs in the optical path and the light source.

FIG. 1 is a photoelastic modulation system 100 that includes a photoelastic modulator (PEM) optical element 102 situated to receive an optical beam 104 from an optical source 106. A PEM transducer 108 is coupled (e.g., attached) to the PEM optical element 102 and is configured to vibrate the PEM optical element 102. The controlled vibration changes characteristics of the optical beam 104 based on the photoelastic effect as the optical beam 104 propagates through the PEM optical element 102. A PEM modulated output beam 110 is produced and is detected by an optical detector 112. The detector 112 produces a PEM detection signal 114 that includes a PEM modulation signal of interest amongst noise and/or other signals. A PEM controller 116 includes a digital frequency generator 118 that produces a PEM driving signal 120 at a selected frequency based on a clock frequency of the digital frequency generator 118. This can eliminate the need to use a PLL-based lock-in amplifier to directly produce the PEM driving signal 120. The PEM modulation signal of interest typically has a frequency that is the same as or is a harmonic of the selected frequency of the PEM driving signal 120. In representative examples, the digital frequency generator 118 includes a direct digital synthesizer that uses the clock frequency to produce an output with a selectable frequency and phase that is used to produce the PEM driving signal 120. The PEM controller 116 receives the PEM detection signal 114 and includes an amplitude/phase demodulator 122 that determines the PEM modulation signal of interest contained in the PEM detection signal 114 by using the clock frequency of the digital frequency generator 118 (rather than a PLL-based lock-in amplifier to find a signal of interest) and the selected signal characteristics (e.g., frequency and phase) of the PEM driving signal 120. In representative examples, demodulation occurs through sine/cosine IQ demodulation, though square waves and other demodulation techniques can be used in different implementations based on common frequencies. By eliminating a PLL-based lock-in amplifier from the PEM driving and detection circuits with the simultaneous production and control of the PEM driving signal 120 and demodulation of the PEM detector signal 114 with the digital frequency generator 118, jitter or other noise that would be introduced with a PLL can be eliminated, improving the signal-to-noise ratio associated with a PEM modulation signal.

To perform analysis with the photoelastic modulation system 100, a sample (not shown) is typically situated to receive the optical beam 104 or the PEM modulated output beam 110. One or more polarizing optical elements (e.g., polarizing filters), additional PEM optical elements, beam steering or scanning devices, reflective and/or refractive components, etc., can also be situated along the path of the optical beam 104 and/or PEM modulated output beam 110. In PLL-based lock-in amplifier approaches, a PEM optical element would be driven using an analog drive circuit carefully tuned to the resonant frequency of a PEM optical element. A PEM-modulated signal would be detected and a lock-in amplifier compares phase changes in the detected PEM-modulated signal to the drive signal, picking out the specific signals activated by the sample. However, PEM optical elements typically have characteristic resonant frequencies, and with the PLL-based lock-in amplifier approaches, driving PEM optical elements at non-resonant frequencies is typically not possible or impractical.

In examples herein, the PEM optical element 102 can be driven by the PEM transducer 108 with the PEM driving signal 120 at a resonant frequency of the PEM optical element 102, as well as at other user-selectable non-resonant frequencies. As discussed above, the digital frequency generator 118 uses the clock signal to produce the frequency and phase characteristics of the PEM driving signal 120. Advantageously, the clock signal of the digital frequency generator 118 also can be used for demodulation of the PEM detection signal 114 to determine the PEM modulation signal, because the PEM modulation signal will have signal characteristics (e.g., frequency, phase) that are synchronized to the clock signal and the selected frequency and phase characteristics (e.g., selected frequency, frequency harmonics, in-phase, phase offset, etc.) of the PEM driving signal 120. The synchronized detection can eliminate the need for a lock-in amplifier and therefore allow driving of the PEM optical element 102 with the PEM transducer 108 at non-resonant frequencies. In particular examples, including those discussed further herein below, multiple PEM optical elements can be driven with synchronous detection using the digital frequency generator 118, or multiple PEM transducers on a single PEM optical element can be driven with synchronous detection using the digital frequency generator 118, each at driving signals with selectable frequencies and/or phase. In some examples, the digital frequency generator 118 can be used to produce the PEM driving signal 120 with frequencies selected in the range of 20 kHz to 100 kHz, though other frequencies and ranges are also possible.

Figure 2:
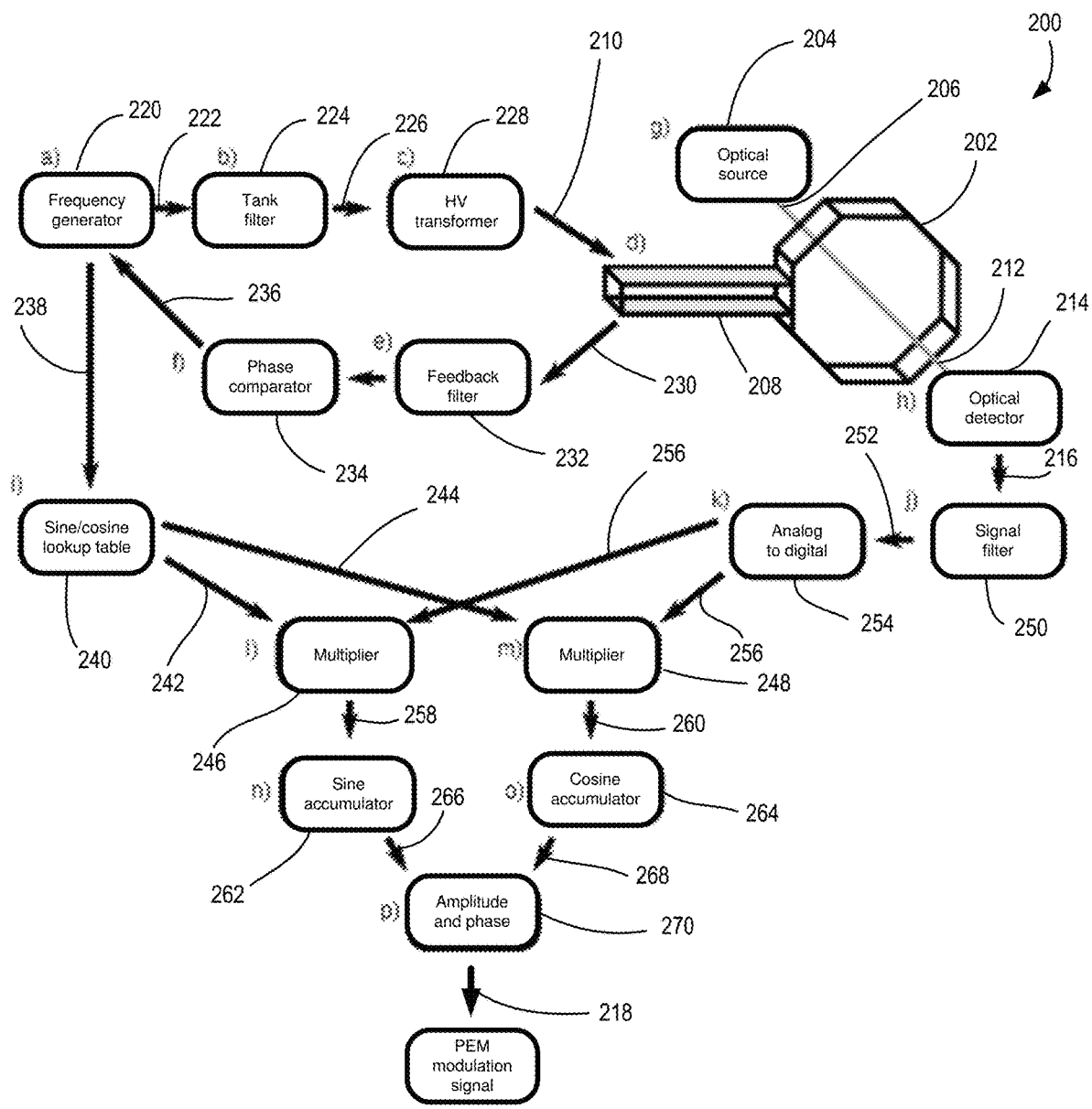

FIG. 2 is an example PEM optical system 200 that includes a PEM optical element 202 optically coupled to an optical source 204 to receive a beam 206. In typical examples, the optical source 204 is a light source, such as one or more laser diodes, laser sources, light emitting diodes, flash-lamps, high-intensity discharge arc lamps, incandescent or fluorescent bulbs, optical beams containing image data, modulated or unmodulated beams (such as pulsed sources, optically chopped continuous sources, etc.), natural light, visible light, star light, etc. A transducer 208 is attached to the PEM optical element 202 and vibrates the PEM optical element 202 according to a PEM driving signal 210. In representative examples, the PEM driving signal 210 is a voltage signal and the transducer 208 converts the voltage signal to a mechanical vibration. The attached PEM optical element 202 vibrates at the same frequency as the PEM driving signal 210, though the PEM optical element 202 tends to resist being driven by the transducer 208 at driving frequencies different from the resonant frequency of the PEM optical element 202. The beam 206 propagates through the PEM optical element 202 as the PEM optical element 202 vibrates and a PEM modulated beam 212 is produced. An optical detector 214 is situated to receive the PEM modulated beam 212 and produces a PEM detection signal 216 that includes a PEM modulation signal 218.

A frequency generator 220 is used to produce an output signal 222 with predetermined user-selected frequency and phase characteristics. In representative examples, the frequency generator 220 is a direct digital synthesizer that produces the output signal 222 with direct digital synthesis using a field programmable gate array (FPGA). The output signal 222 can be a high-low square wave signal that can be directed as an analog signal through a tank filter 224, such as an inductor-inductor-capacitor (LLC) circuit, to produce an analog sinusoidal output 226 with high efficiency. The analog sinusoidal output 226 is directed to a high-voltage transformer 228 typically having a high turn ratio and that converts the analog sinusoidal output 226, having a relatively small peak to peak voltage difference, to the PEM driving signal 210 at a higher voltage suitable for driving the transducer 208 (e.g., 3.3 V, 3 to 5 V, 5 V, 5 to 10 V, 100 to 500 V, etc.). In representative examples, the transducer 208 is a piezoelectric transducer crystal that is responsive to the PEM driving signal 210 to vibrate the PEM optical element 202 with the piezoelectric effect. However, other transducers or controllable vibrating devices can be used as well.

The PEM driving signal 210 received by the transducer 208 can also be return coupled to the frequency generator 220 with return signal 230. In representative examples, the high voltage sine wave of the PEM driving signal 210 and a current waveform signal corresponding to the current completing the circuit loop through the transducer 208 can together form the return signal 230. The voltage and current waveforms of the return signal 230 are filtered with one or more feedback filters 232 configured to remove high frequency switching noise and electromagnetic interference. In some examples, the feedback filters 232 include one or more Sallen-Key filters. Representative examples of the feedback filters 232 also convert the sinusoidal waveforms of the return signal 230 into square-wave waveforms that can be easier to interpret. The voltage and current waveforms of the return signal 230 are then directed through a phase comparator 234 that compares the voltage and current waveforms to determine a phase difference 236. The frequency generator 220 can use the phase difference 236 to adjust the characteristics of the synthesized frequency output signal 222, including a phase adjustment that can be used to remove system delays introduced by various components of the PEM optical system 200, such as the tank filter 224, high-voltage transformer 228, feedback filters 232, and/or phase comparator 234. The return signal 230 can also be used to characterize the response of the transducer 208 at different selected frequencies of the output signal 222 and associated PEM driving signal 210. Representative examples can use the amplitude of the current of the return signal 230 to determine the amplitude of modulation at the PEM as well as phase alignment.

The PEM optical system 200 provides a synchronized detection configuration that uses a common clock signal both in generating the output signal 222 and in demodulating the PEM detection signal 216 to determine the PEM modulation signal 218. To extract the PEM modulation signal 218, a second output signal 238 from the frequency generator 220 corresponding to the momentary phase of the output signal 222 is directed to a sine/cosine look-up table 240 to generate numerical sine and cosine values 242, 244. The sine and cosine values 242, 244 are directed to respective digital multipliers 246, 248 that can operate as signal mixers or analogue multipliers. To obtain synchronous detection, the PEM detection signal 216 is directed through a signal filter 250 configured to reduce noise in the PEM detection signal 216, such as high frequency noise, low frequency noise, or both high and low frequency noise, to form a filtered PEM detection signal 252. The filtered PEM detection signal 252 is received by an analog-to-digital converted (ADC) 254 that converts the filtered PEM detection signal 252 to a digital PEM detection signal 256. The digital PEM detection signal 256 is directed to the digital multipliers 246, 248 and multiplier outputs 258, 260 are produced corresponding to the synchronized mixing of the sine and cosine values 242, 244 with the digital PEM detection signal 256. The multiplier outputs 258, 260 are directed to respective sine and cosine accumulators 262, 264 to produce accumulated and time integrated values until a sufficiently large number of samples 266, 268 has been collected (such as 1 sample, 5 samples, 10 samples, 100 samples, 500 samples, etc.). An amplitude and phase calculator 270 calculates a phase of the PEM modulation signal 218 based on the samples 266, 268, and the values and/or the PEM modulation signal 218 can be output to a user, e.g., with a display or in a file. The generation of the PEM driving signal 210 and synchronized detection of the PEM detection signal 256 (and corresponding synchronized demodulation to determine the PEM modulation signal 218), can differ from traditional lock-in amplifier approaches because a PLL is not used to lock onto an external reference frequency. PLLs operate reactively, introducing jitter as the PLL catches up to frequency changes in its reference waveform. The PEM optical system 200 uses a single frequency generator 220 to control both the detection frequency and modulation frequency simultaneously, thereby eliminating noise associated with a PLL.

Figure 3:
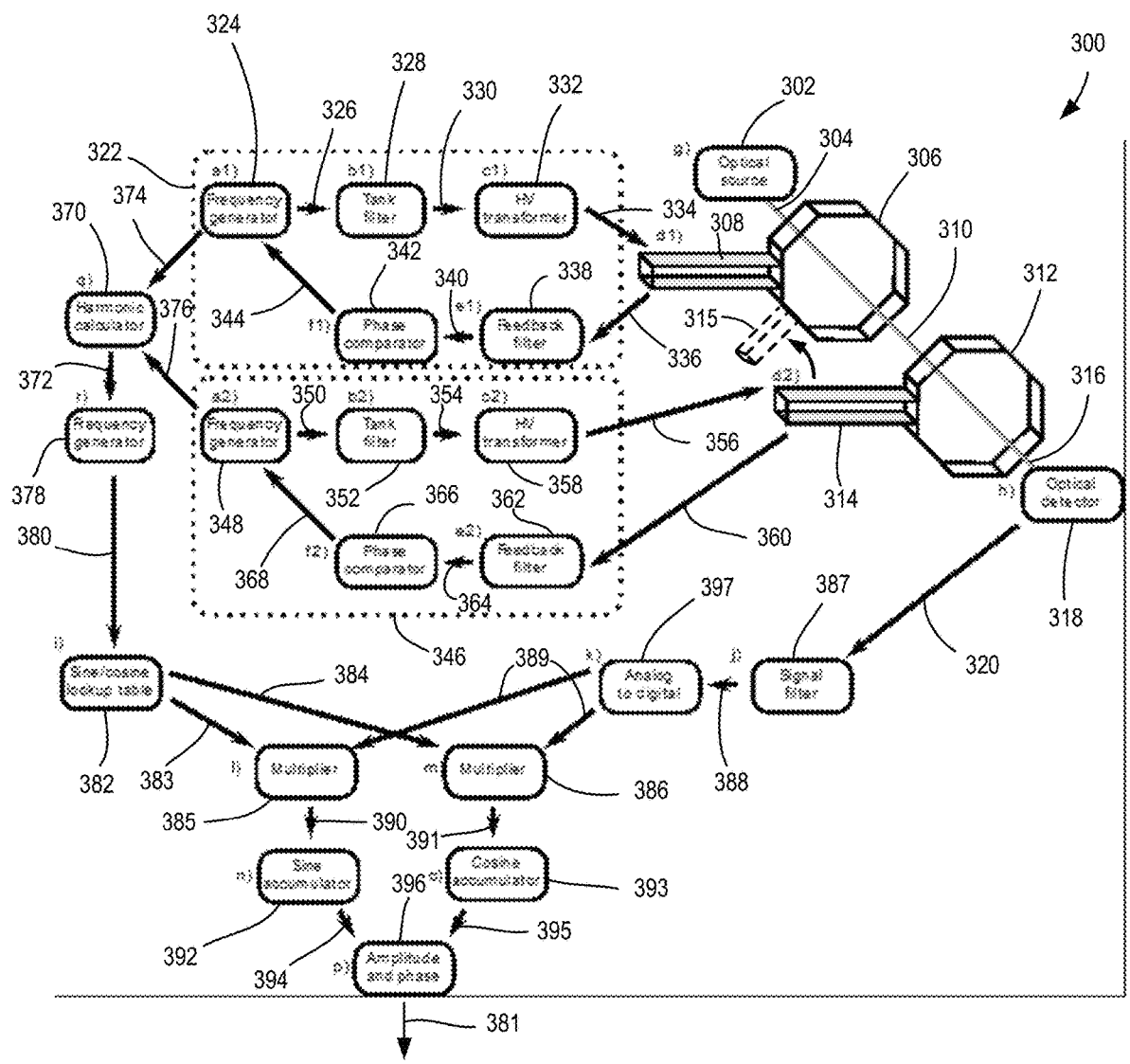

FIG. 3 is a PEM optical system 300 that includes an optical source 302 situated to direct an optical beam 304 to a first PEM optical element 306 coupled to a transducer 308. As the transducer 308 vibrates the first PEM optical element 306, the optical beam 304 passes through the first PEM optical element 306 to become a first PEM modulated optical beam 310. The first PEM modulated optical beam 310 is directed through a second PEM optical element 312 that is coupled to a transducer 314 to form a second PEM modulated optical beam 316 as the second PEM optical element 312 controllably vibrates. In typical examples, various optical elements, such as polarizers, waveplates, lenses, and samples can be situated along the path of the beam 304, the first PEM modulated optical beam 310, and/or the second PEM modulated optical beam 316. In some examples, additional PEM optical elements can be situated along the beam path. In selected examples, the transducer 314 can instead be coupled to the PEM optical element 312, as shown with outline 315, to provide PEM modulation along an axis different from the transducer 308, so as to form a dual (or multiple) transducer coupled optical element (such as shown in U.S. Provisional Application No. 62/593,628, which is incorporated herein by reference). An optical detector 318 is situated to receive the second modulated optical beam 316 and to produce a PEM detection signal 320.

A first PEM modulation unit 322 includes a frequency generator 324 configured to produce an output signal 326 with a predetermined first frequency. A tank filter 328 filters the output signal 326 to produce a filtered signal 330 that is amplified by a high-voltage transformer 332 to produce a PEM driving signal 334 that drives the transducer 308. A return path from the transducer 308 directs a return signal 336 to a feedback filter 338 to produce a filtered return signal 340 and to a phase comparator 342 that compares voltage and current components of the return signal 336 to determine a phase difference. The determined phase difference 344 is received by the frequency generator 324 to adjust a phase of the output signal 326. A second PEM modulation unit 346 can include a similar array of frequency generation components, and some of such components can be shared or be part of the components of the first PEM modulation unit 322. Thus, the second PEM modulation unit 346 includes a frequency generator 348 configured to produce an output signal 350 with a predetermined second frequency. In representative examples, the predetermined second frequency of the output signal 350 can be the same or different from the predetermined first frequency of the output signal 326 and is typically carefully selected for detection in the PEM detection signal 320 of a predetermined harmonic or frequency combination of the predetermined first and/or second frequencies. The output signal 350 can also be directed to a tank filter 352 to produce a filtered signal 354 that is used to produce a PEM driving signal 356 with a high voltage transformer 358. A return path from the transducer 314 can also direct a return signal 360 to a feedback filter 362 to produce a filtered return signal 364 and to a phase comparator 366 that compares voltage and current components of the return signal 360 to determine a phase difference. The determined phase difference 368 can be received by the frequency generator 348 to adjust a phase of the output signal 350. In some examples, the frequency generators 324, 348 use a common field programmable gate array and reference clock to produce the output signals 326, 350 with direct digital synthesis. However, in some examples, the first and second PEM modulation units 322, 346 can correspond to separate computing and/or processing units, and/or can include different frequency generation components.

The frequency generators 324, 348 can be coupled to a harmonic calculator 370 that can be used to calculate a harmonic frequency of interest 372 based on a harmonic or harmonics of interest. For example, it may be desirable to measure a second harmonic associated with the first PEM optical element 306 oscillating according to the PEM driving signal 334 combined with a first harmonic associated with the second PEM optical element 312 oscillating according to the PEM driving signal 356. However, any combinations of harmonics can be selected and calculated. The harmonic calculator 370 receives output signals 374, 376, which can be the same as the output signals 326, 350, calculates the harmonic frequency of interest 372, and directs the value to a frequency generator 378. Representative harmonic calculations can vary for different implementations. For example, in some instances, a user may wish to measure a number of harmonics, but hardware may be limited to a discrete number of synchronous detectors (e.g., desired measurement of 1F, 2F, 2F+1F, and 2F+2F with hardware that can only measure 3 frequencies at a time). Thus, selected harmonics may change on the fly (e.g., between measurement sets, periodically or in a predetermined sequence or pattern fashion within measurement sets, etc.). In the example above combining the second harmonic associated with the first PEM optical element 306 and the first harmonic associated with the second PEM optical element 312, the harmonic calculator 370 can add the frequency of the output signal 376 to twice the frequency of the output signal 374 to produce a calculated harmonic frequency signal 380 that can be used to determine a PEM modulation signal 381 based on the PEM detection signal 320 that is synchronously detected according to a common reference clock used by the frequency generators 324, 348, 378. However, it will be appreciated that other frequency calculations and combinations are possible. In representative examples, the harmonic calculator 370 can also change a calculated harmonic to produce the harmonic frequency of interest 372 as a harmonic variation occurs during phase comparison and the phase controller adjusts the frequency of the PEM driving signal to maintain resonance. Thus, the harmonic calculator 370 can provide updated harmonic calculations. In some examples, multiple harmonics can be measured simultaneously, such as with additional harmonic calculators and associated frequency generators. In further examples, the PEM optical system 300 can include additional PEM optical elements and harmonics can be based on the additional PEM optical elements as well. Thus, additional examples of the PEM optical system 300 can be expanded to accommodate as many harmonics and PEM optical elements as desired.

In representative examples, to obtain signal extraction of the PEM modulation signal 381 from the PEM detection signal 320, the calculated harmonic frequency signal 380 with momentary phase is received by a sine/cosine look-up table 382 and numerical sine and cosine values 383, 384 are generated. The sine and cosine values 383, 384 are directed to digital multipliers 385, 386. Synchronous with the clock signal used by the frequency generators 324, 348, 378, the PEM detection signal 320 is received and filtered with a signal filter 387 to produce a filtered signal 388. The filtered signal 388 is converted to a digital detection signal 389 with an ADC 397 and the digital detection signal 389 is also received by the digital multipliers 385, 386. The digital multipliers 385, 386 mix the digital detection signal 389 with the respective sine and cosine values 383, 384 to produce multiplier outputs 390, 391 that are received by respective sine and cosine accumulators 392, 393. The sine and cosine accumulators 392, 393 produce accumulated and time integrated values until a sufficiently large number of samples 394, 395 has been collected, and an amplitude and phase calculator 396 calculates a phase of the PEM modulation signal 381 (associated with the selected harmonic) based on the samples 394, 395. The samples, values, and/or the PEM modulation signal 381 can then be stored, displayed, or used for further processing.

Figure 4:
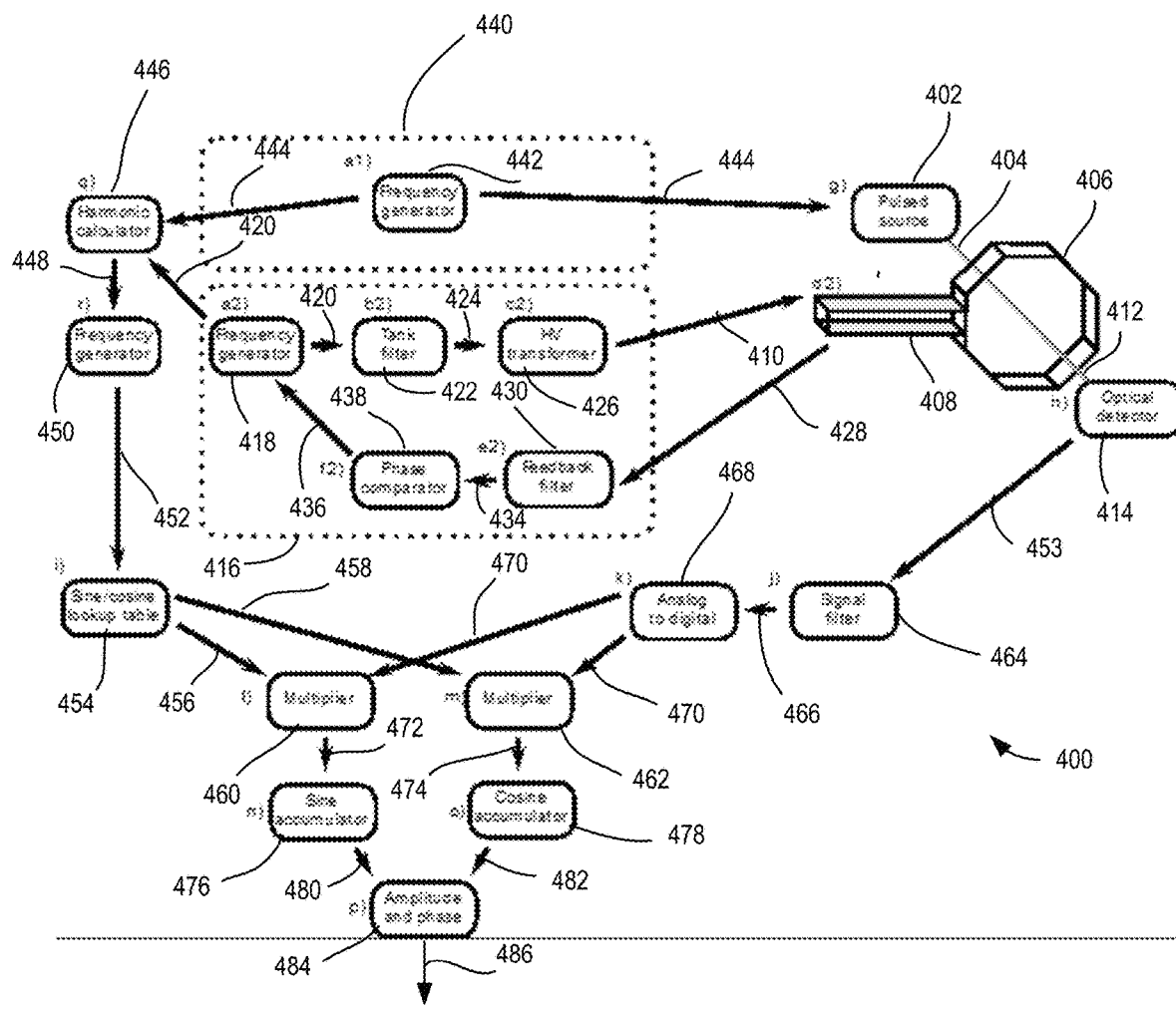

FIG. 4 is an example PEM optical system 400 that includes a pulsed optical source 402 situated to produce a pulsed optical beam 404. The pulsed optical beam is directed through a PEM optical element 406 coupled to a transducer 408 that vibrates the PEM optical element 406 according to a PEM driving signal 410. The vibrating PEM optical element 406 modulates the pulsed optical beam 404 based on the photoelastic effect to produce a PEM modulated pulsed optical beam 412 that is subsequently detected with an optical detector 414. A PEM modulation unit 416 is configured to provide the PEM driving signal 410 with a frequency generator 418 that produces output signal 420, such as a high/low square wave, at a predetermined PEM driving frequency. The output signal 420 can be coupled to a tank filter 422 (e.g., LLC) to produce a smooth sinusoid signal 424 that becomes amplified to form the PEM driving signal 410 with a high voltage transformer 426 or other suitable voltage source. A return circuit from the transducer 408 can direct a return signal 428 to a feedback filter 430 to produce a filtered return signal 434. A phase difference 436 between current and voltage signal components of the filtered return signal 434 can be compared with a phase comparator 438 and the phase difference 436 can be received by the frequency generator 418 to adjust a phase of the output signal 420. In typical examples the frequency generator 418 uses an FPGA or other suitable processing unit to produce the output signal 420 through direct digital synthesis. In some examples, a pulsed source modulation unit 440 is configured with a frequency generator 442 that can produce a pulse source signal 444 based on a common clock used by the frequency generator 418. The pulsed source frequency signal 444 is coupled to the pulsed optical source 402 to direct the pulsed optical source 402 to produce the pulsed optical beam 404 with predetermined pulse timing characteristics, such as producing pulses according to a selected frequency. Thus, the pulsed source 402 can operate in a slave relationship with the PEM modulation and PEM pulsed source modulation units 416, 440. In typical examples, the pulsed source frequency signal 444 is selected to be in a frequency range supported by the pulsed optical source 402.

The output signals 420, 444 can also be directed to a harmonic calculator 446 situated to calculate a harmonic frequency of interest 448 based on the received output signals 420, 444 and a user selection. Using the reference clock of the frequency generators 418, 442 and the harmonic frequency of interest 448, a frequency generator 450 can be configured to produce a harmonic output signal 452 that is synchronized with a PEM detection signal 453 produced with the optical detector 414 during vibration of the PEM optical element 406 and pulsed operation of the pulsed optical source 402. The harmonic output signal 452 is directed to a sine/cosine LUT 454 and separate numerical sine and cosine values 456, 458 are directed to respective digital multipliers 460, 462. The synchronously detected PEM detection signal 453 is directed to a signal filter 464 that produces a filtered signal 466 that is received by an ADC 468. The ADC 468 converts the filtered signal 466 to a digital signal 470 that is directed to the digital multipliers 460, 462 and digitally mixed with the numerical sine and cosine values 456, 458. Digital multiplier outputs 472, 474 are directed to sine and cosine accumulators 476, 478 that produce a sufficient number of time-integrated samples 480, 482 that are used by an amplitude/phase calculator 484 to extract a PEM modulation signal 486. In some examples, the output signal 420 can correspond to the output signal 444 provided to the pulsed optical source 402, with or without a phase delay. In some examples, the harmonic calculator 446 and frequency generator 450 can be omitted.

Figure 5:
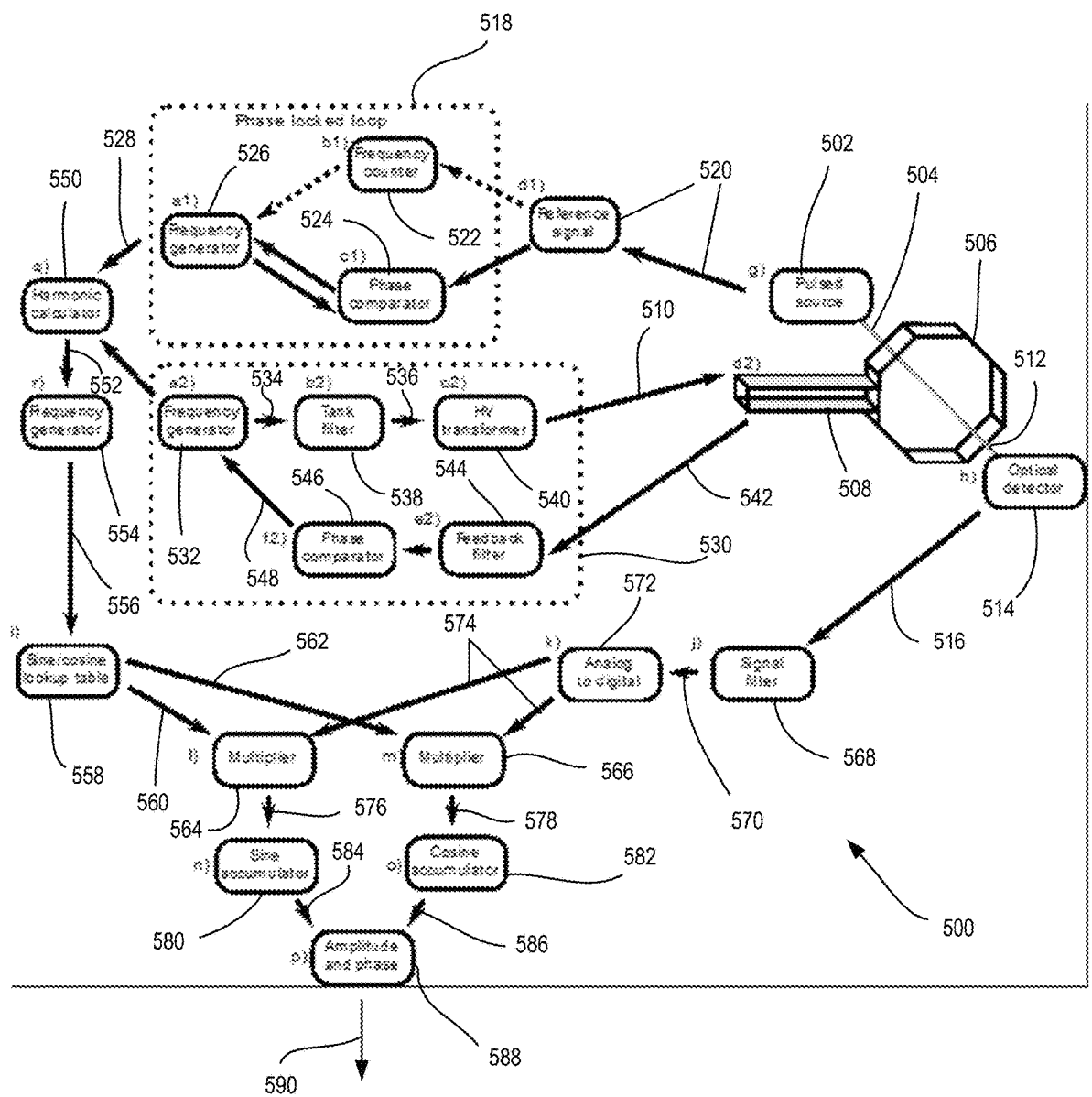

An example PEM optical system 500 in FIG. 5 includes a pulsed optical source 502 situated in a master control configuration as opposed to a slave configuration. The pulsed optical source 502 produces a pulsed optical beam 504 according to an internally selected frequency. The pulsed optical beam 504 is directed through a PEM optical element 506 that is vibrated with a transducer 508 according to a PEM driving signal 510. The vibrating PEM optical element 506 produces a PEM modulated beam 512 that is detected with an optical detector 514 which produces a PEM detection signal 516. With the pulsed optical source 502 controlling the frequency of the pulsed optical beam 504, a phase locked loop 518 is situated to lock-on to a frequency signal 520 of the pulsed optical source 502. The phase locked loop 518 includes a frequency counter 522, phase comparator 524, and frequency generator 526. The PLL 518 receives the frequency signal 520 as an input and produces an output signal 528 that is locked to the momentary phase of the frequency signal 520 and that is provided at the frequency of or a harmonic of the frequency signal 520. The PEM driving signal 510 is produced with a PEM modulation unit 530 that includes a frequency generator 532 configured to produce an output signal 534 having a predetermined user-selected frequency. The output signal 534 is produced with direct digital synthesis based on a clock signal of the PEM modulation unit 530, such as with an FPGA reference clock. In representative examples, the output signal 534 can include a high-low square wave that is converted to a sinusoidal signal 536 with a tank filter 538. The sinusoidal signal 536 is amplified to a suitable voltage for the driving the transducer 508 with a high-voltage transformer 540. A return path 542 from the high-voltage transformer 540 can be coupled through a feedback filter 544 and a phase comparator 546 can be used to determine and output a phase difference 548 between current and voltage components of the signal propagating along the return path 542. The frequency generator 532 can adjust a phase of the synthesized output signal 534 based on the phase difference 548. A harmonic calculator 550 is configured to calculate a desired harmonic frequency of interest 552 based on the output signals 528, 534. For example, for the pulsed source 502 operating at 10 MHz (and separately controlled), and the PEM 506 being driven at 50 kHz, a signal of interest for detection could include 10.05 MHz and 9.95 MHz. The phase locked loop 518 can then be used to lock onto the 10 MHz signal so that the exact frequency of interest at 10.05 MHz and 9.95 MHz can be established. The harmonic frequency 552 is directed to a frequency generator 554 that produces a corresponding harmonic frequency signal 556 which is synchronized with the PEM detection signal 516 using the reference clock of the PEM modulation unit 530. The harmonic frequency signal 556 is directed to a sine/cosine LUT 558 to produce separate numerical sine and cosine values 560, 562 that are directed to respective digital multipliers 564, 566. The synchronously detected PEM detection signal 516 is directed to a signal filter 568 that produces a filtered signal 570 that is received by an ADC 572. The ADC 572 converts the filtered signal 570 to a digital signal 574 that is directed to the digital multipliers 564, 566 and digitally mixed with the numerical sine and cosine values 560, 562. Digital multiplier outputs 576, 578 are directed to sine and cosine accumulators 580, 582 that produce a sufficient number of time-integrated samples 584, 586 that are used by an amplitude/phase calculator 588 to extract a synchronized PEM modulation signal 590.

Figure 6:
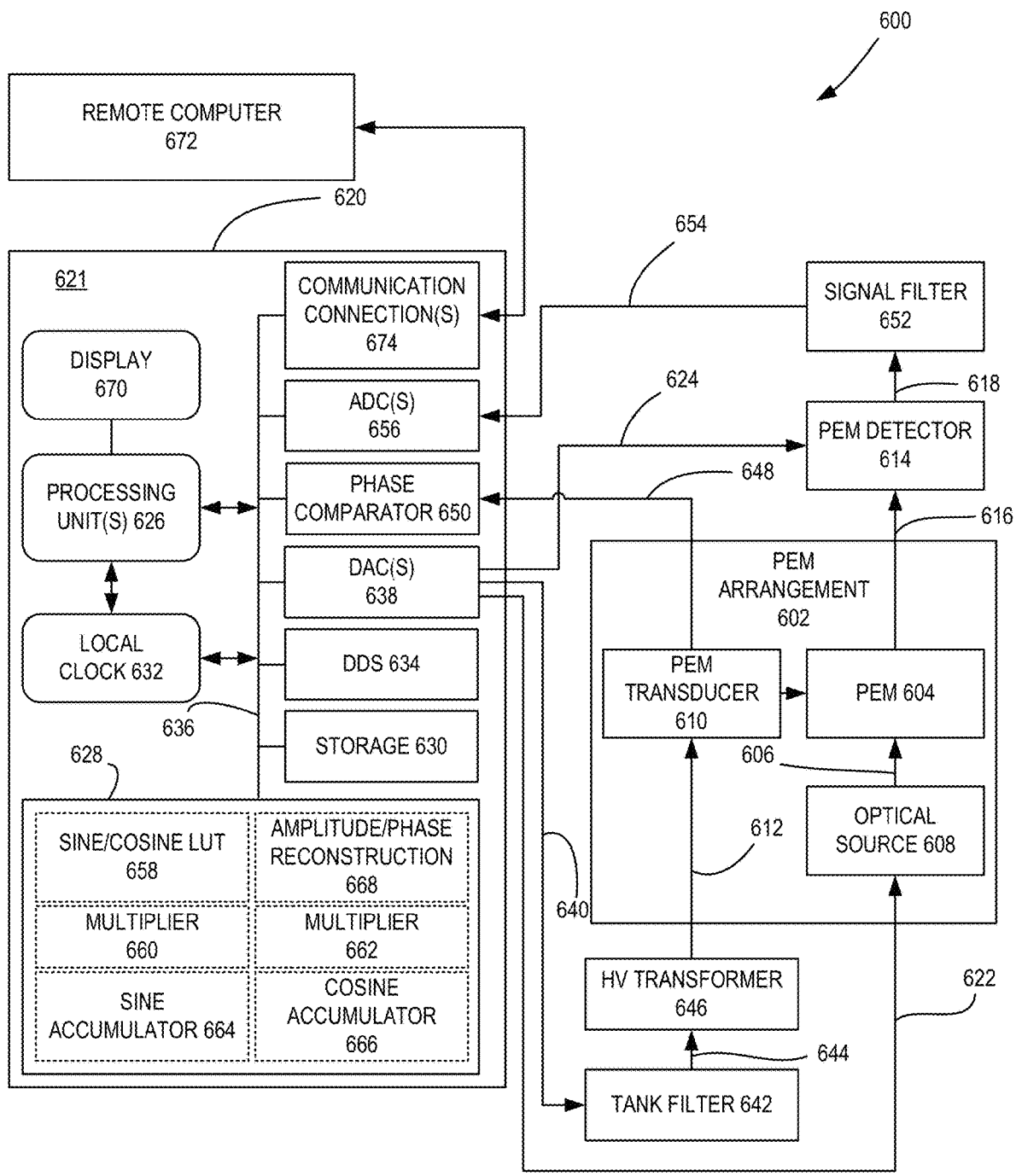

FIG. 6 and the following discussion are intended to provide a brief, general description of an exemplary computing environment in which the disclosed technology may be implemented. Although not required, the disclosed technology is described in the general context of computer-executable instructions, such as program modules, being executed by a computing unit, dedicated processor, or other digital processing system or programmable logic device. Generally, program modules include routines, programs, objects, components, data structures, etc., that perform particular tasks or implement particular abstract data types. Moreover, the disclosed technology may be implemented with other computer system configurations, including handheld devices, multiprocessor systems, microprocessor-based or programmable consumer electronics, network PCs, minicomputers, mainframe computers, dedicated processors, MCUs, PLCs, ASICs, FPGAs, CPLDs, systems on a chip, and the like. The disclosed technology may also be practiced in distributed computing environments where tasks are performed by remote processing devices that are linked through a communications network. In a distributed computing environment, program modules may be located in both local and remote memory storage devices.

With reference to FIG. 6, an example PEM modulation apparatus 600 is shown that includes a PEM arrangement 602 with a PEM optical element 604 situated to modulate an input beam 606 produced with an optical source 608. The PEM arrangement 602 also includes a transducer 610 coupled to the PEM optical element 604 and configured to controllably vibrate the PEM optical element 604 with a PEM driving signal 612. An optical detector 614 is situated to receive a PEM modulated beam 616 and to produce a corresponding PEM detection signal 618. For simplicity, a single PEM optical element is shown though it will be appreciated that the PEM modulation apparatus 600 can include multiple PEM optical elements and/or transducers (including e.g., multiple transducers on a single PEM optical element), including separate PEM optical elements for separate Stokes polarimetry parameters Q, U, V, based on, e.g., Mueller matrix calculus. Also, additional optical components, such as analyzers (e.g., linear polarizers, circular polarizers, rotatable polarizers, calcite polarizers, Glan-Taylor prisms, Glan-Foucault prisms, absorptive polarizers, etc.), lenses/mirrors, waveplates, and optical samples to be analyzed, can be situated along the beam path between the optical source 608 and optical detector 614. In representative examples, the PEM optical element 604 modulates polarization characteristics of the input beam 606 by vibration form the transducer 610 that moves and/or stresses the PEM optical element 604 along a modulation axis generally perpendicular to the path of the input beam 606. The optical detector 614 can be of various types, such as a CCD, CMOS sensor, photodiode, spectrometer, or other optical sensor.

The PEM modulation apparatus 600 also includes a PEM controller 620 having a computing environment 621. The PEM controller 620 is configured to control a timing and frequency of the PEM driving signal 612. In some examples, the PEM controller 620 can also control a timing and frequency of the optical source 608 with an optical source control signal 622. In further examples, the PEM controller 620 can further control a timing and frequency of gating or triggering the PEM detector 614 with a detector trigger signal 624. In particular examples, the optical source 608 can be pulsed according to a signal internal to the optical source 608 that is directed to the PEM controller 620, and the PEM controller 620 can synchronize frequency generation and production of the PEM driving signal 612 for synchronized extraction of a PEM modulation signal from the PEM detection signal 618.

The PEM controller 620 can include one or more processors 626 and memories 628. In some examples, the processor 626 can be configured based on reduced or complex instruction set computing architectures, and can include one or more general purpose central processing units, application specific integrated circuits, graphics or co-processing units or other processing units. In representative examples, the processor 626 is a field programmable gate array. In some examples, the computing environment 621 can be distributed in the form of separate processors and/or other computing or controller devices in communication with one or more other components of the computing environment 621 or PEM apparatus 600, including one or more FPGA, PLC, PLD, CPLD, PAL, ASIC, PLL, control logic, relay, detector, amplifier, digitizer, etc. The memory 628 can be volatile memory (e.g., registers, cache, RAM), non-volatile memory (e.g., ROM, EEPROM, flash memory, etc.), or a combination of volatile and non-volatile memory. The memory 628 is generally accessible by the processor 626 and can store software in the form computer-executable instructions that can be executed by the processor 626 coupled to the memory 628. The memory 628 can also include or be coupled to removable or non-removable storage 630 including magnetic media, CD-ROMS, DVDs, or any other medium that can be used to store information in a non-transitory way and which can be accessed within the computing environment 621.

The PEM controller 620 includes a local reference clock 632 that provides a stable clock signal from which various components of the PEM modulation apparatus 600 can be timed to operate, including a direct digital synthesizer 634. One or more system buses 636 can provide a communication path between various environment components. In representative examples, the DDS 634 produces a high/low square-wave signal at a predetermined user-selected frequency and using the local reference clock 632. A digital-to-analog converter (DAC) 638 is configured to send the high/low square-wave signal as an analog output signal 640 to a tank filter 642, converting the output signal 640 to a sinusoidal signal 644, and then to a high-voltage transformer 646 that converts sinusoidal signal 644 to the PEM driving signal 612. A current return path 648 from the PEM transducer 610 can be coupled to a phase comparator 650 of the PEM controller 620 to compare current and voltage components of the signal received along the current return path 648 to determine a phase difference. The determined phase difference can be used by the DDS 634 to adjust a momentary phase of the PEM driving signal 612. The PEM detection signal 618 can be filtered with a signal filter 652 to produce a filtered detection signal 654 with a reduced high frequency and/or low frequency noise components. The filtered detection signal 654 can be directed to an analog-to-digital converter (ADC) 656 to convert the filtered detection signal 654 into a digital signal. In representative examples, the high/low square-wave signal produced with the local reference clock 632 is compared with a sine/cosine look-up table 658 stored in the memory 628 and corresponding numerical sine and cosine values are sent to digital multipliers 660, 662. The digital values of the filtered detection signal 654 are also synchronously received by the digital multipliers 660, 662 to produce digitally mixed values that are received by respective sine and cosine accumulators 664, 666. With a sufficient number of time-integrated samples, an amplitude/phase calculator 668 (e.g., IQ detection) can extract the PEM modulation signal from the PEM detection signal 618 by scaling the value of the sine and cosine accumulators 664, 666 by the number of samples collected.

A number of program modules (or data) may be stored in the storage devices 630 including an operating system, one or more application programs, other program modules, and program data. In representative examples, the memory 628 can store instructions, data arrays, look-up tables, etc., implementing one or more method steps and algorithms described herein. In some examples, the PEM controller 620 can adjust transducer driving frequency or phase based on the PEM detection signal 618, which is synchronously detected with generation of the PEM driving signal 612 using the local reference clock 632. In particular examples, a frequency signal is received from the optical source 608 and one or more lock-in amplifiers or PLLs are used to lock onto the external reference frequency provided by the optical source 608. In some examples, the detected characteristics of the PEM modulated beam 616 can be correlated to determine Stokes polarimetry parameters Q, U, and V, based on, e.g., Mueller matrix calculus. A user may enter commands (e.g., frequency selection) and information into the PEM controller environment 621 through one or more input devices, such as a keyboard and a pointing device such as a mouse. Other input devices may include a digital camera, microphone, satellite dish, scanner, display, or the like. These and other input devices are often connected to the one or more processing units 626 through a serial port interface that is coupled to the system bus 636, but may be connected by other interfaces such as a parallel port, game port, universal serial bus (USB), or Ethernet port. A monitor 670 or other type of display device is also connected to the system bus 636 via an interface, such as a video adapter. In representative examples, the monitor 670 can show the calculated PEM modulation signal. Some or all data and instructions can be communicated with a remote computer 672 through communication connections 674 (e.g., wired, wireless, etc.) if desired.

Figure 7:
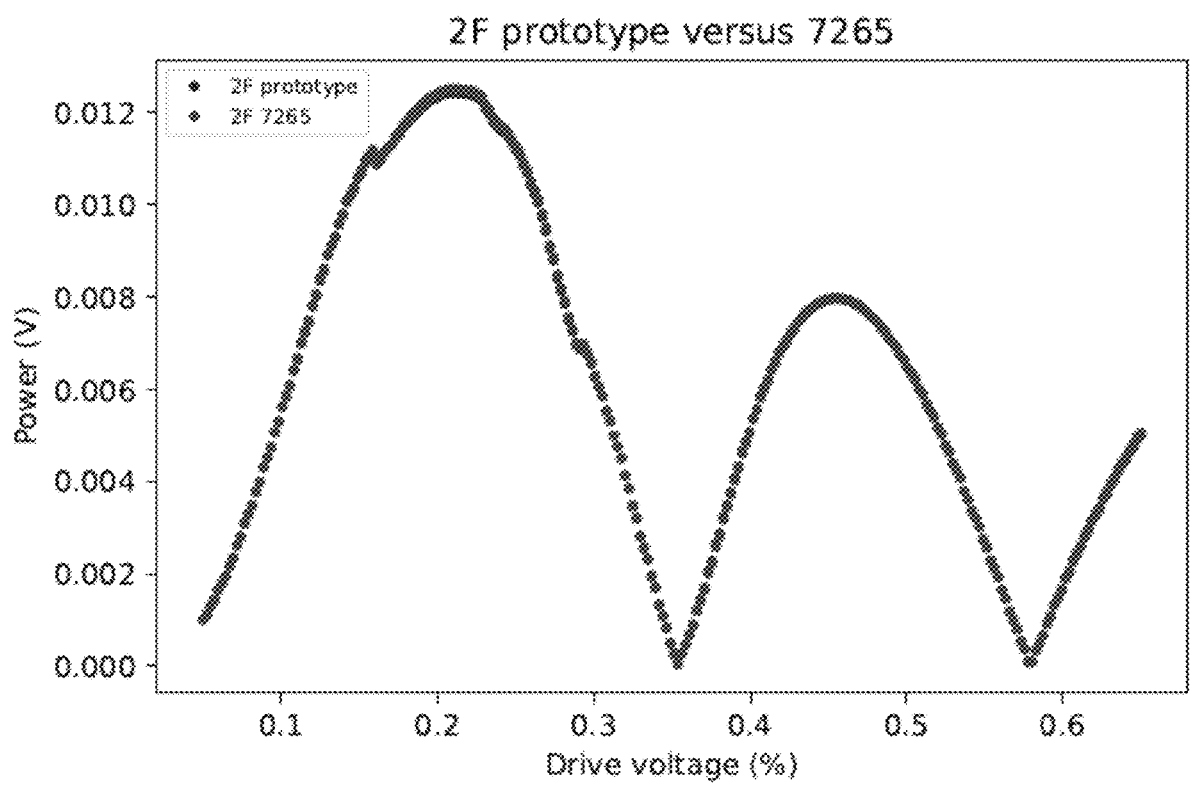
FIGS. 7-9 are graphs depicting performance of synchronized detection apparatus and performance comparisons with PLL-based lock-in amplifier approaches.
Figure 8:
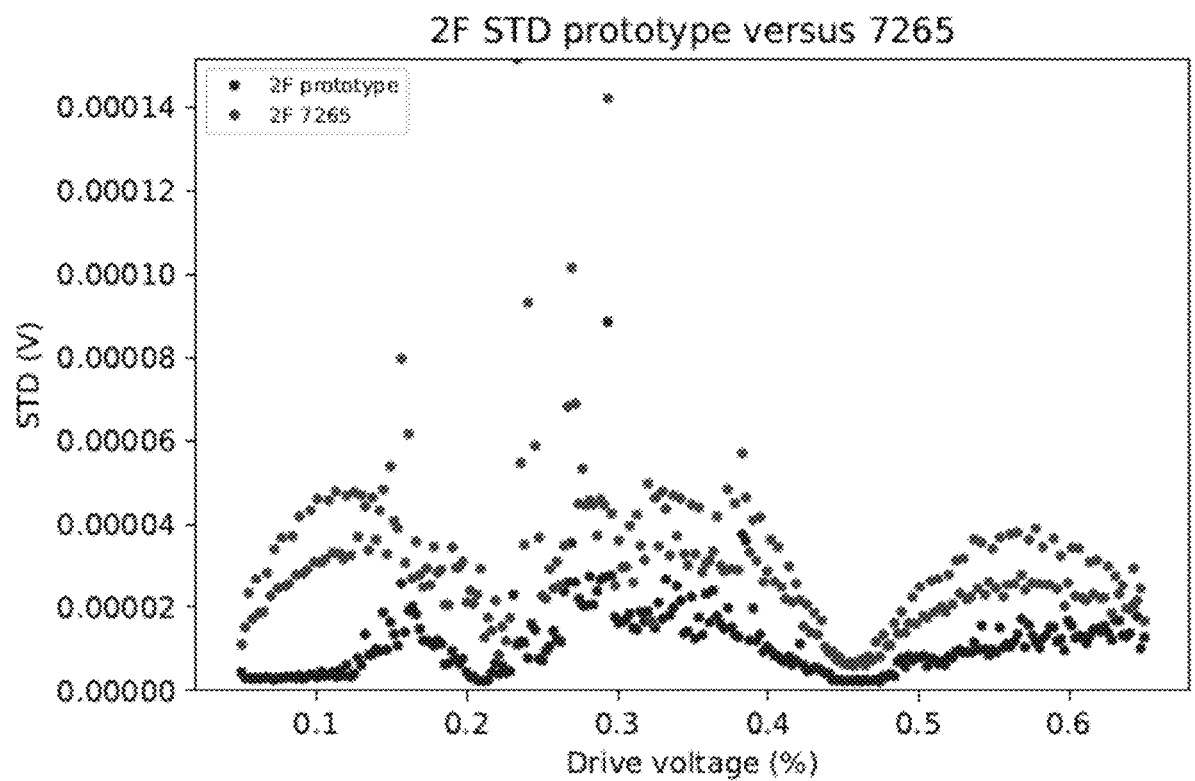
Figure 9:
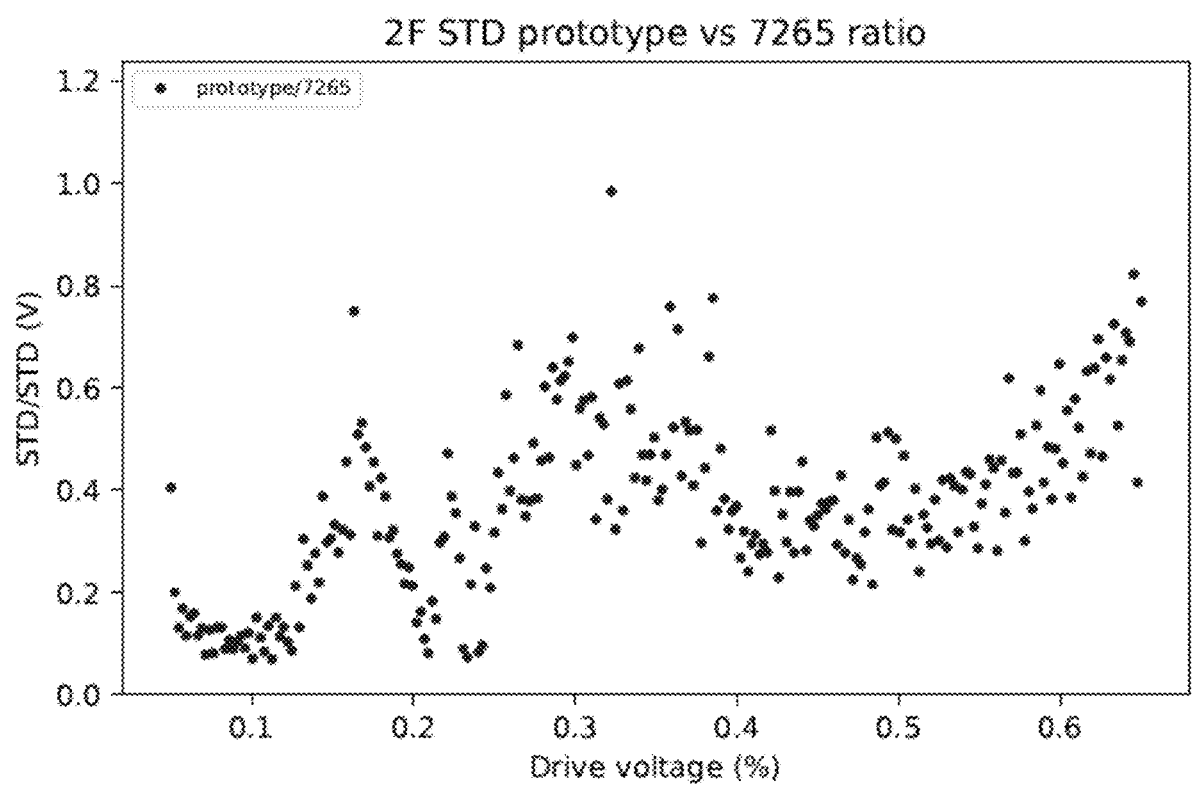

FIGS. 7-9 show performance characteristics of example PEM optical apparatus and systems herein as compared with a model 7265 PLL-based lock-in amplifier approach. FIG. 7 shows a characteristic Bessel function for a PEM modulation signal detected at various PEM driving signal voltages. The plotted values of performance for synchronized detection according to the disclosed technology overlap with plotted values of performance for lock-in approaches, showing that synchronized detection approaches perform at least as well as lock-in approaches. In FIG. 7, each point represents 64 samples. FIG. 8 plots a standard deviation of voltage for the 64 samples of each point in FIG. 7 and shows that the synchronized detection according to the disclosed technology herein has, on average, a lower voltage standard deviation. The lower voltage standard deviation is indicative of a lower signal to noise ratio provided by removing PLL-based lock-in amplification. FIG. 9 plots the ratio of the standard deviations shown in FIG. 8. Because the ratios are generally lower than unity, FIG. 9 demonstrates the superior performance that can be achieved using various synchronized detection examples herein.

Figure 10:
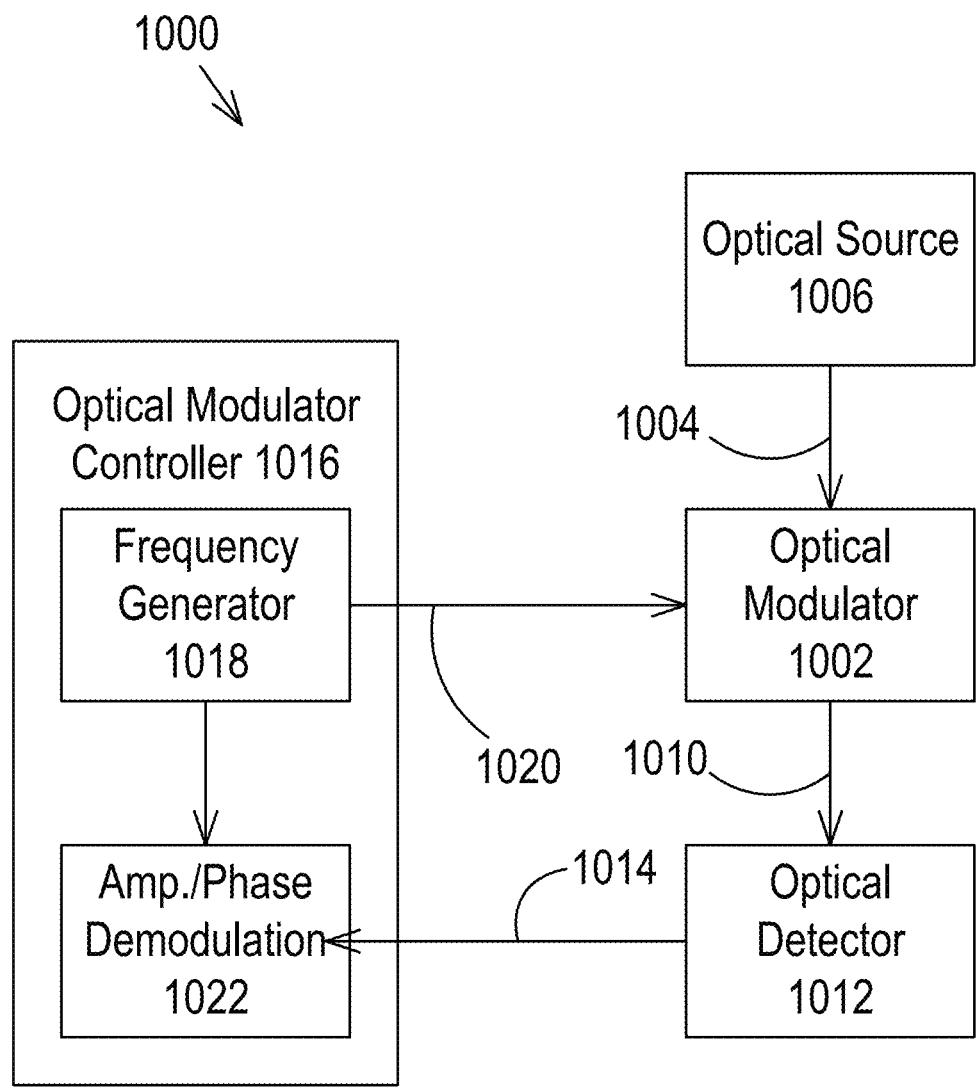
FIG. 10 is a schematic of an example optical modulation system.

FIG. 10 is an optical modulation system 1000 that includes an optical modulator 1002 situated to receive an optical beam 1004 from an optical source 1006. Examples of the optical modulator 1002 can include PEM type arrangements (such as PEM transducers coupled to PEM optical elements), acousto-optic modulators, and/or electro-optic modulators. Representative optical modulators operate at resonant frequencies, though non-resonant frequencies can be employed as well. In general, in accordance with various examples described hereinabove, the cost and incremental noise associated with lock-in amplifiers can be reduced or eliminated. The optical beam 1004 is modulated with the optical modulator 1002 to produce an optically modulated output beam 1010 that is detected with an optical detector 1012. The optical detector 1012 produces an optical modulator detection signal 1014 that includes an optical modulation signal of interest amongst noise and/or other signals. An optical modulator controller 1016 includes a digital frequency generator 1018 that produces an optical modulator driving signal 1020 at a selected frequency based on a clock frequency of the digital frequency generator 1018. As discussed above, this can eliminate the need to use a PLL-based lock-in amplifier to directly produce the optical modulator driving signal 1020. The optical modulation signal of interest typically has a frequency that is the same as or is a harmonic of the selected frequency of the optical modulator driving signal 1020. In representative examples, the digital frequency generator 1018 includes a direct digital synthesizer that uses the clock frequency to produce an output with a selectable frequency and phase that is used to produce the optical modulator driving signal 1020. The optical modulator controller 1016 receives the optical modulator detection signal 1014 and includes an amplitude/phase demodulator 1022 that determines the optical modulation signal of interest contained in the optical modulator detection signal 1014 by using the clock frequency of the digital frequency generator 1018 (e.g., rather than a PLL-based lock-in amplifier to find a signal of interest) and the selected signal characteristics (e.g., frequency and phase) of the optical modulator driving signal 1020.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

I claim:

1. An apparatus, comprising:
    an optical modulator;
    a controller having a digital frequency generator configured to produce a frequency signal at a selected frequency based on a clock signal of the controller, wherein the controller is configured to produce an optical modulator driving signal based on the frequency signal and to direct the optical modulator driving signal to the optical modulator to drive the optical modulator; and
    a detector optically coupled to the optical modulator and configured to synchronously detect an optically modulated output and to produce an optical modulator detection signal that includes an optical modulation signal;
    wherein the controller is configured to receive the synchronously detected optical modulator detection signal and to extract the optical modulation signal from the optical modulator detection signal based on a mixing and demodulation of the frequency signal, the clock signal, and the synchronously detected optical modulator detection signal.

2. The apparatus of claim 1, wherein the optical modulator is an acousto-optic modulator or an electro-optic modulator.

3. The apparatus of claim 1, wherein the optical modulator comprises a photoelastic modulator (PEM) optical element, and a PEM transducer coupled to the PEM optical element and the controller and configured to drive the PEM with a PEM driving signal that corresponds to the optical modulator driving signal;
    wherein the optically modulated output corresponds to a PEM modulated output, the optical modulator detection signal corresponds to a PEM detection signal, and the optical modulation signal corresponds to a PEM modulation signal.

4. The apparatus of claim 3, wherein the selected frequency is a non-resonant frequency of the PEM optical element.

5. The apparatus of claim 3, further comprising an optical source situated to direct an optical beam to the PEM optical element, wherein the optical source is situated to receive an optical source frequency signal from the controller that is produced with the clock signal and situated to produce the optical beam according to the optical source frequency signal.

6. The apparatus of claim 3, further comprising an optical source situated to direct an optical beam to the PEM optical element, wherein the controller is situated to receive an optical source frequency signal from the optical source and configured to produce the frequency signal based on the clock signal and the optical source frequency signal.

7. The apparatus of claim 6, wherein the controller is configured to lock onto the optical source frequency signal with a phase-locked loop.

8. The apparatus of claim 3, further comprising a second PEM optical element and a second PEM transducer coupled to the second PEM optical element to drive the second PEM optical element according to a second PEM driving signal, wherein the controller has a second frequency generator configured to produce a second frequency signal at a selected second frequency based on the clock signal of the controller, wherein the controller is configured to produce a PEM driving signal based on the second frequency signal.

9. The apparatus of claim 8, wherein the second frequency is different from the frequency of the frequency signal.

10. The apparatus of claim 8, wherein the controller is configured to calculate a harmonic of the frequency and the second frequency and to produce a corresponding harmonic frequency signal, and wherein a frequency of the extracted PEM modulation signal corresponds to the frequency of the harmonic frequency signal.

11. The apparatus of claim 1, further comprising a tank filter, wherein the frequency signal is a square-wave high-low signal and the tank filter is configured to convert the square-wave high-low signal to a sinusoidal signal.

12. The apparatus of claim 11, further comprising a high voltage transformer configured to receive the sinusoidal signal and to produce the PEM driving signal.

13. The apparatus of claim 3, further comprising:
a feedback filter coupled to the PEM transducer and configured to filter a return signal from the PEM transducer to produce a filtered return signal; and
a phase comparator situated to receive the filtered return signal and configured to compare current and voltage signal components of the filtered return signal to determine a phase difference.

14. The apparatus of claim 13, wherein the feedback filter includes a Sallen-Key filter.

15. The apparatus of claim 13, wherein the controller is configured to mix momentary phase numerical sine and cosine values of the frequency signal selected from a look-up table with the PEM detection signal and to calculate amplitude and phase of the PEM modulation signal from the mixed values.

16. The apparatus of claim 1, wherein the controller is configured to trigger the detector based on the frequency signal.

17. The apparatus of claim 1, wherein the controller includes a field programmable gate array configured to produce the frequency signal with direct digital synthesis.

18. The apparatus of claim 3, further comprising a second PEM transducer coupled to the PEM optical element to drive the PEM optical element according to a second PEM driving signal.

19. A method, comprising:
generating an optical modulator driving signal with a controller frequency generator configured to produce a frequency signal at a selected frequency based on a clock signal of the controller;
driving the optical modulator according to the optical modulator driving signal;
synchronously detecting an optically modulated output from the optical modulator; and
determining an optical modulation signal based on a mixing and demodulation of the frequency signal, clock signal, and the synchronously detected optically modulated output.

20. The method of claim 19, wherein generating an optical modulator driving signal comprises generating a PEM driving signal, wherein driving the optical modulator comprises driving a PEM transducer coupled to a PEM optical element according to the PEM driving signal, wherein synchronously detecting the optically modulated output comprises synchronously detecting a PEM modulated output from the PEM optical element, and wherein determining an optical modulation signal comprises determining a PEM modulation signal based on a mixing and demodulation of the frequency signal, clock signal, and the synchronously detected PEM modulated output.

21. The method of claim 19, wherein the controller frequency generator is a direct digital synthesizer of a field programmable gate array.

22. The method of claim 19, further comprising generating an optical source frequency signal based on the frequency signal and the clock signal; and
producing a pulsed optical beam according to the optical source frequency signal.

23. The method of claim 20, further comprising generating a second PEM driving signal and driving a second PEM transducer coupled to a second PEM optical element according to the second PEM driving signal.

24. The method of claim 19, wherein the optical modulator driving signal is an acousto-optic modulator driving signal or an electro-optic modulator driving signal.

25. A method comprising:
producing a direct digital synthesized high-low signal output at a predetermined optical modulator driving frequency;
producing a high-low voltage signal corresponding to the high-low signal output with a voltage source;
filtering the high-low voltage signal with a tank filter to produce a sinusoidal signal; and
amplifying the sinusoidal signal with a high voltage transformer to produce an optical modulator driving signal;
synchronously detecting an optical modulator output signal produced in response to the optical modulator driving signal; and
determining an optical modulation signal by mixing the optical modulator output signal with frequency and clock signals associated with the digital synthesized high-low signal output, and then by demodulating the mixed signal.

26. The method of claim 25, wherein the predetermined optical modulator driving frequency is a PEM driving frequency and wherein the optical modulator driving signal is a PEM driving signal.

27. An apparatus, comprising:
an optical modulator;
a controller having a frequency generator configured to produce a frequency signal at a selected frequency based on a clock signal of the controller, wherein the controller is configured to produce an optical modulator driving signal based on the frequency signal and to direct the optical modulator driving signal to the optical modulator to drive the optical modulator; and
a detector optically coupled to the optical modulator and configured to receive an optically modulated output and to produce an optical modulator detection signal that includes an optical modulation signal;
wherein the optical modulator comprises a photoelastic modulator (PEM) optical element, and a PEM transducer coupled to the PEM optical element and the controller and configured to drive the PEM with a PEM driving signal that corresponds to the optical modulator driving signal;
wherein the optically modulated output corresponds to a PEM modulated output, the optical modulator detection signal corresponds to a PEM detection signal, and the optical modulation signal corresponds to a PEM modulation signal;
a feedback filter coupled to the PEM transducer and configured to filter a return signal from the PEM transducer to produce a filtered return signal; and
a phase comparator situated to receive the filtered return signal and configured to compare current and voltage signal components of the filtered return signal to determine a phase difference;
wherein the controller is configured to receive the optical modulator detection signal and to extract the optical modulation signal from the optical modulator detection signal using the frequency signal and the clock signal.

28. The apparatus of claim 27, wherein the feedback filter includes a Sallen-Key filter.

29. The apparatus of claim 27, wherein the controller is configured to mix momentary phase numerical sine and cosine values of the frequency signal selected from a lookup table with the PEM detection signal and to calculate amplitude and phase of the PEM modulation signal from the mixed values.

* * * * *